United States Patent
Yang et al.

(10) Patent No.: US 11,968,503 B2
(45) Date of Patent: Apr. 23, 2024

(54) CURRENT DETECTION CIRCUIT, CHIP, AND CURRENT DETECTION METHOD USED FOR SPEAKER PROTECTION

(71) Applicant: SHANGHAI AWINIC TECHNOLOGY CO., LTD, Shanghai (CN)

(72) Inventors: Zhifei Yang, Shanghai (CN); Haijun Zhang, Shanghai (CN); Liming Du, Shanghai (CN); Jiantao Cheng, Shanghai (CN); Hongjun Sun, Shanghai (CN)

(73) Assignee: SHANGHAI AWINIC TECHNOLOGY CO., LTD., Shanghai (CN)

( * ) Notice: Subject to any disclaimer, the term of this patent is extended or adjusted under 35 U.S.C. 154(b) by 128 days.

(21) Appl. No.: 17/755,882

(22) PCT Filed: Sep. 24, 2020

(86) PCT No.: PCT/CN2020/117346
§ 371 (c)(1),
(2) Date: May 11, 2022

(87) PCT Pub. No.: WO2021/093467
PCT Pub. Date: May 20, 2021

(65) Prior Publication Data
US 2022/0386023 A1    Dec. 1, 2022

(30) Foreign Application Priority Data

Nov. 12, 2019   (CN) .......................... 201911098669.8

(51) Int. Cl.
*H03G 11/00*   (2006.01)
*G01R 19/25*   (2006.01)
(Continued)

(52) U.S. Cl.
CPC ......... *H04R 3/007* (2013.01); *G01R 19/2509* (2013.01)

(58) Field of Classification Search
CPC ........................... H04R 3/007; G01R 19/2509
(Continued)

(56) References Cited

U.S. PATENT DOCUMENTS 3,976,955 A      8/1976  Hamada
2018/0288543 A1* 10/2018 Shen ....................... H03F 3/213

FOREIGN PATENT DOCUMENTS

| CN | 101465619 A | 6/2009 |
| CN | 201312286 Y | 9/2009 |

(Continued)

OTHER PUBLICATIONS

PCT International Search Report of PCT/CN2020/117346 issued on Jan. 4, 2021.

*Primary Examiner* — Ammar T Hamid
(74) *Attorney, Agent, or Firm* — Emerson, Thomson & Bennett, LLC; Roger D. Emerson; Jarrett Wyatt

(57) ABSTRACT

A current detection circuit and method for protecting a speaker, and a chip are provided. The current detection circuit includes a current detection module and an analog-to-digital converter. The current detection module samples a current flowing through the speaker based on current mirror technology, and converts the current into a voltage to output a first voltage signal and a second voltage signal. The analog-to-digital converter converts the first voltage signal and the second voltage signal into a PDM code, to calculate a current parameter of the speaker.

12 Claims, 10 Drawing Sheets

(51) Int. Cl.
*H04R 3/00* (2006.01)
*H04R 29/00* (2006.01)

(58) Field of Classification Search
USPC .................................................. 381/55, 56
See application file for complete search history.

(56) References Cited

FOREIGN PATENT DOCUMENTS

| | | | |
|---|---|---|---|
| CN | 103427650 | A | 12/2013 |
| CN | 103795036 | A | 5/2014 |
| CN | 105811761 | A | 7/2016 |
| CN | 109546978 | A | 3/2019 |
| CN | 109546979 | A | 3/2019 |
| CN | 105811761 | B | 8/2019 |
| CN | 110632381 | A | 12/2019 |
| EP | 1418667 | A1 | 5/2004 |

\* cited by examiner

Charging during a positive half cycle

Discharging during a positive half cycle

Charging during a negative half cycle

Discharging during a negative half cycle

CURRENT DETECTION CIRCUIT, CHIP, AND CURRENT DETECTION METHOD USED FOR SPEAKER PROTECTION

This application is a National Stage of International Application No. PCT/CN2020/117346, titled "CURRENT DETECTION CIRCUIT, CHIP, AND CURRENT DETECTION METHOD USED FOR SPEAKER PROTECTION," filed Sep. 24, 2020, which claims the benefit of and priority to Chinese Patent Application No. 201911098669.8, titled "CURRENT DETECTION CIRCUIT, CHIP, AND CURRENT DETECTION METHOD USED FOR SPEAKER PROTECTION," filed Nov. 12, 2019, the entireties of which are hereby incorporated herein by reference.

FIELD

The present disclosure relates to the technical field of semiconductor integrated circuits, and in particular to a current detection circuit and method for protecting a speaker, and a chip.

BACKGROUND

A Class_D audio power amplifier has advantages such as high efficiency, low heat generation, good performance, and thus is widely used in portable devices such as a Bluetooth speaker and a mobile phone.

Since the portable device trends to be compact so as to be portable, a built-in speaker generally has a relatively small cavity. When a power amplifier plays a loud song, especially a high bass song, the speaker cavity may be damaged due to causes such as excessive displacement of a diaphragm or high temperature of the speaker.

In a case that the Class_D audio power amplifier outputs a high power, especially in a case that clipping occurs, a current flowing through the speaker is large. In this case, a current detection module accurately detects the current flowing through the speaker to protect the speaker. However, when the clipping occurs, a speaker output terminal VON or VOP may be at a high level or a low level during several pulse width modulation (PWM) cycles, and thus some current detection methods are not applicable to this case. The Class_D audio power amplifier is generally provided with a function of anti-chipping, that is, to actively limit an output power of the Class_D, so as to avoid chipping. In this way, the output terminals VON and VOP output a square wave in each PWM cycle. In this case, however, the output power of the Class_D is reduced, resulting in failure to maximize the high-power performance of the speaker.

Moreover, some current detection methods rely on a detection circuit. For example, a detection resistor is connected in series to a source of a power switch transistor, to sample a voltage across the detection resistor, so as to acquire the current. However, the detection circuit is added to a current path of the speaker, which increases power loss, resulting in a reduction in overall efficiency of the Class_D.

Therefore, how to provide a current detection circuit without affecting high-power output of the speaker is an urgent technical problem to be solved by those skilled in the art.

SUMMARY

In view of this, a current detection circuit and method for protecting a speaker, and a chip are provided according to the present disclosure, to solve the above technical problem.

The following technical solutions are provided according to embodiments of the present disclosure.

A current detection circuit for protecting a speaker is provided. The current detection circuit includes a current detection module and an analog-to-digital converter. A first input terminal of the current detection module is connected to a first speaker output terminal. A second input terminal of the current detection module is connected to a second speaker output terminal. The current detection module is configured to sample a current flowing through the speaker and convert the sampled current into a voltage, to output a first voltage signal and a second voltage signal. A first input terminal of the analog-to-digital converter is connected to a first output terminal of the current detection module. A second input terminal of the analog-to-digital converter is connected to a second output terminal of the current detection module. The analog-to-digital converter is configured to convert the first voltage signal and the second voltage signal into a PDM code, to calculate a current parameter of the speaker.

In an embodiment, in the above current detection circuit, the current detection module includes a first current detection sub-module, a second current detection sub-module and a conversion sub-module. The first current detection sub-module is configured to acquire a first current parameter at the first speaker output terminal. The second current detection sub-module is configured to acquire a second current parameter at the second speaker output terminal. The conversion sub-module is configured to convert the first current parameter into the first voltage signal and convert the second current parameter into the second voltage signal.

In an embodiment, in the above current detection circuit, the first current detection sub-module includes a first switch, a second switch, a first comparator, a first power transistor, a second power transistor, a third power transistor and a fourth power transistor. A first terminal of the first switch is connected to the first speaker output terminal, and a second terminal of the first switch is connected to a non-inverting input terminal of the first comparator. A first terminal of the second switch is grounded, and a second terminal of the second switch is connected to the non-inverting input terminal of the first comparator. An inverting input terminal of the first comparator is connected to a joint at which the first power transistor is connected to the fourth power transistor. An output terminal of the first comparator is connected to a gate of the first power transistor. A source of the first power transistor is connected to a first terminal of the fourth power transistor, and a drain of the first power transistor is connected to a drain of the second power transistor. A second terminal of the fourth power transistor is connected to a voltage input terminal, and a third terminal of the fourth power transistor is grounded. The voltage input terminal is connected to a first joint at which a source of the second power transistor is connected to a source of the third power transistor. The drain of the second power transistor is connected to a second joint at which a gate of the second power transistor is connected to a gate of the third power transistor.

In an embodiment, in the above current detection circuit, the first power transistor and the fourth power transistor each are an N-type power transistor. The second power transistor and the third power transistor each are a P-type power transistor.

In an embodiment, in the above current detection circuit, the fourth power transistor is an integrated power transistor formed by n N-type power transistors connected in series, where n is greater than or equal to one.

In an embodiment, in the above current detection circuit, the second current detection sub-module includes a third switch, a fourth switch, a second comparator, a fifth power transistor, a sixth power transistor, a seventh power transistor and an eighth power transistor. A first terminal of the third switch is connected to the second speaker output terminal, and a second terminal of the third switch is connected to a non-inverting input terminal of the second comparator. A first terminal of the fourth switch is grounded, and a second terminal of the fourth switch is connected to the non-inverting input terminal of the second comparator. An inverting input terminal of the second comparator is connected to a joint at which the fifth power transistor is connected to the eighth power transistor. An output terminal of the second comparator is connected to a gate of the fifth power transistor. A source of the fifth power transistor is connected to a first terminal of the eighth power transistor, and a drain of the fifth power transistor is connected to a drain of the sixth power transistor. A second terminal of the eighth power transistor is connected to a voltage input terminal, and a third terminal of the eighth power transistor is grounded. The voltage input terminal is connected to a third joint at which a source of the sixth power transistor is connected to a source of the seventh power transistor. The drain of the sixth power transistor is connected to a fourth joint at which a gate of the sixth power transistor is connected to a gate of the seventh power transistor.

In an embodiment, in the above current detection circuit, the fifth power transistor and the eighth power transistor each are an N-type power transistor. The sixth power transistor and the seventh power transistor each are a P-type power transistor.

In an embodiment, in the above current detection circuit, the eighth power transistor is an integrated power transistor formed by m N-type power transistors connected in series, where m is greater than or equal to one.

In an embodiment, in the above current detection circuit, the conversion sub-module includes a first resistor, a second resistor, a first capacitor, a second capacitor and a third comparator. The first resistor is connected in parallel with the first capacitor to form a first branch, a first terminal of the first branch is connected to an output terminal of the first current detection sub-module and a non-inverting input terminal of the third comparator, and a second terminal of the first branch is connected to a first output terminal of the third comparator. The second resistor is connected in parallel with the second capacitor to form a second branch, a first terminal of the second branch is connected to an output terminal of the second current detection sub-module and an inverting input terminal of the third comparator, a second terminal of the second branch is connected to a second output terminal of the third comparator. The first output terminal of the third comparator serves as the first output terminal of the current detection module. The second output terminal of the third comparator serves as the second output terminal of the current detection module.

A chip is provided. The chip includes the current detection circuit according to any one of the above embodiments.

A current detection method for protecting a speaker is provided. The current detection method includes: sampling a current flowing through the speaker, and converting the sampled current into a first voltage signal and a second voltage signal; converting the first voltage signal and the second voltage signal into a PDM code; and calculating a current parameter of the speaker based on the PDM code.

In an embodiment, in the above current detection circuit, the sampling a current flowing through the speaker, and converting the sampled current into a first voltage signal and a second voltage signal includes: sampling, during a positive half cycle of a sine wave, a current outputted from a first speaker output terminal of the speaker, to acquire a first current parameter; sampling, during a negative half cycle of the sine wave, a current outputted from a second speaker output terminal of the speaker, to acquire a second current parameter; and converting the first current parameter into the first voltage signal, and converting the second current parameter into the second voltage signal.

Compared with the conventional technology, the present disclosure has the following beneficial effects.

In the current detection circuit according to the present disclosure, a current detection module samples a current flowing through a speaker based on current mirror technology, and converts the current into a voltage to output a first voltage signal and a second voltage signal. The circuit does not increase the power loss of the Class_D circuit.

In addition, an analog-to-digital converter converts the first voltage signal and the second voltage signal into a PDM code, to calculate a current parameter of the speaker. Therefore, even if the Class_D outputs a high power, the current of the speaker can be detected normally without a function of anti-chipping.

BRIEF DESCRIPTION OF THE DRAWINGS

In order to illustrate technical solutions in embodiments of the present disclosure or in the conventional technology more clearly, drawings to be used in the description of the embodiments or the conventional technology are introduced simply hereinafter. It is apparent that the drawings described below show only some embodiments of the present disclosure. For those skilled in the art, other drawings may be obtained based on the provided drawings without any creative work.

DETAILED DESCRIPTION OF THE EMBODIMENTS

Technical solutions in embodiments of the present disclosure are described clearly and completely in conjunction with the drawings in the embodiments of the present disclosure hereinafter. It is apparent that the described embodiments are only some rather than all embodiments of the present disclosure. All other embodiments obtained by those skilled in the art based on the embodiments of the present disclosure without any creative work fall within the protection scope of the present disclosure.

To make the above objects, features and advantages of the present disclosure transpicuous, the present disclosure is illustrated in detail in conjunction with the drawings and specific embodiments hereinafter.

Figure 1:
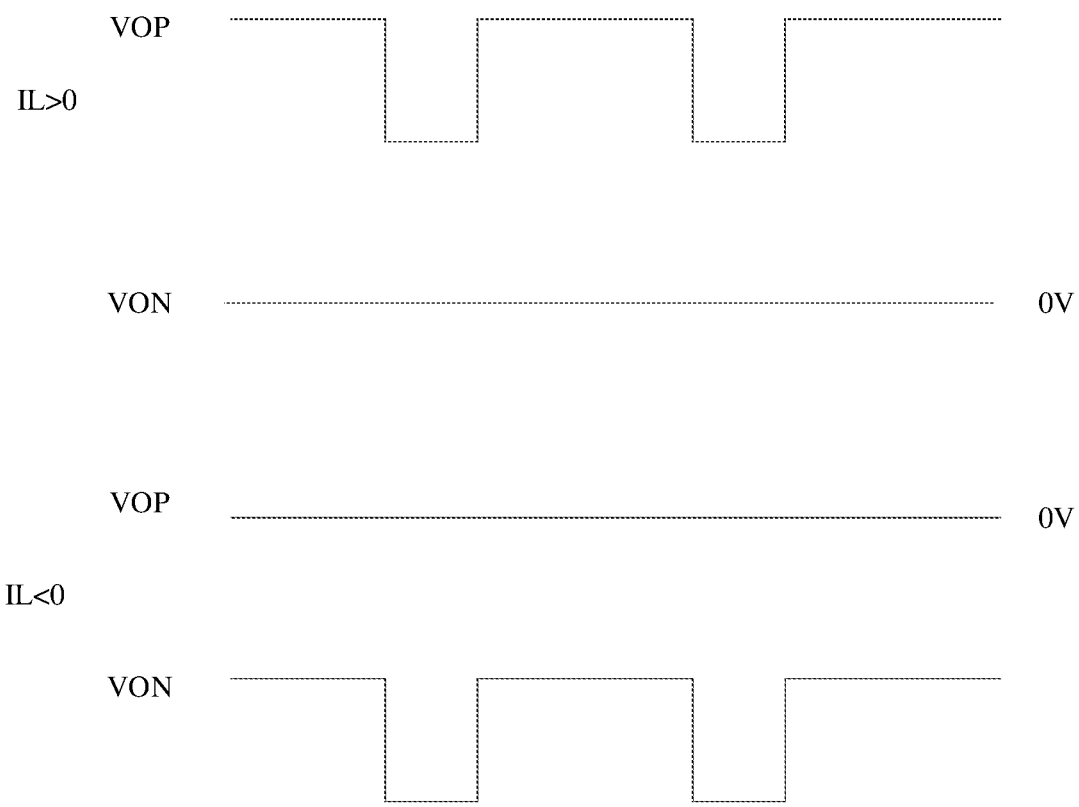
FIG. 1 is a schematic diagram showing output waveforms of a Class_D in a tri-state modulation mode according to an embodiment of the present disclosure.

Reference is made to FIG. 1, which is a schematic diagram showing output waveforms of a Class_D in a tri-state modulation mode according to an embodiment of the present disclosure.

As shown in FIG. 1, in a case that a load current IL is greater than zero, that is, in a case that the load current flows from a terminal VOP to a terminal VON, duration that the VOP is at a high level is longer than duration that the VOP is at a low level in a PWM cycle. The VON is constantly at a low level during a positive half cycle of an output signal of the Class_D. That is, during the positive half cycle of the output signal, a low-side power NMOS transistor of the VON is constantly on and the load current constantly flows through the low-side power NMOS transistor of the VON.

Further, during a positive half cycle of a sine wave (VOP-VON), the current flows from the terminal VOP to the terminal VON, and a power transistor NMOS2 is constantly on.

Figure 2:
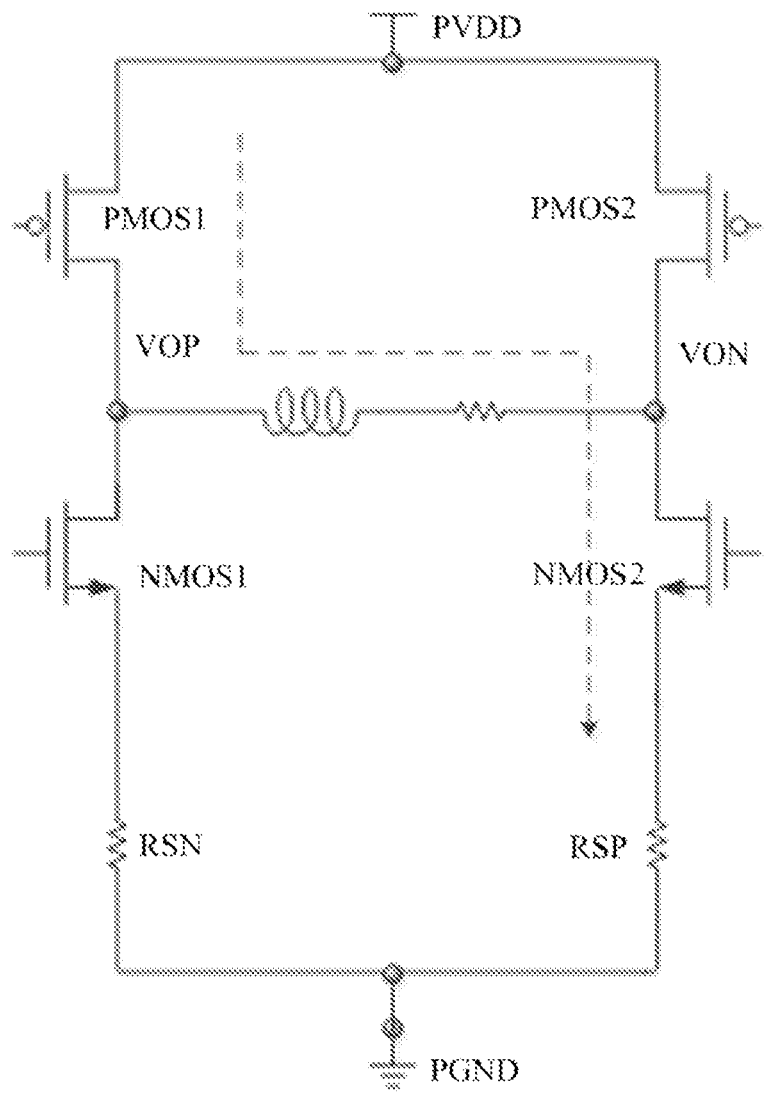
FIG. 2 is a schematic diagram showing a charging process of the Class_D in the tri-state modulation mode during a positive half cycle of a sine wave according to an embodiment of the present disclosure.

Reference is made to FIG. 2, which is a schematic diagram showing a charging process of the Class_D in the tri-state modulation mode during a positive half cycle of a sine wave according to an embodiment of the present disclosure.

Figure 3:
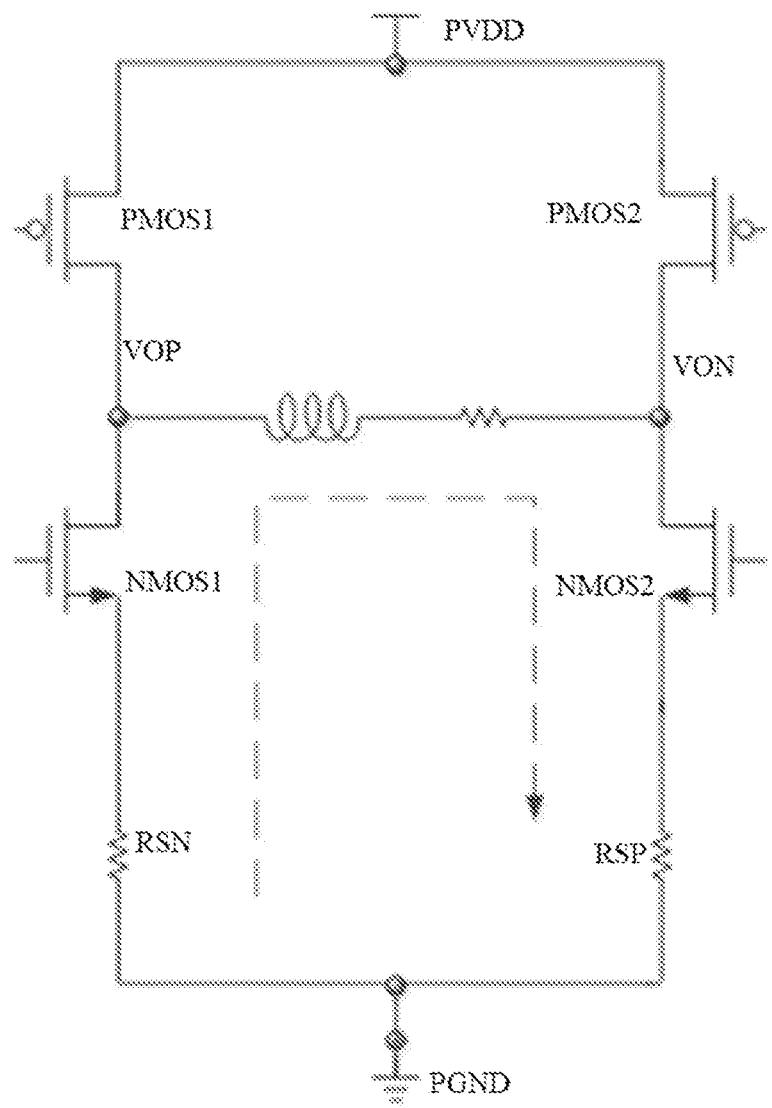
FIG. 3 is a schematic diagram showing a discharging process of the Class_D in the tri-state modulation mode during a positive half cycle of a sine wave according to an embodiment of the present disclosure.

Reference is made to FIG. 3, which is a schematic diagram showing a discharging process of the Class_D in the tri-state modulation mode during a positive half cycle of a sine wave according to an embodiment of the present disclosure.

Further, during a negative half cycle of a sine wave (VOP-VON), the current flows from the terminal VON to the terminal VOP, and a power transistor NMOS1 is constantly on.

Figure 4:
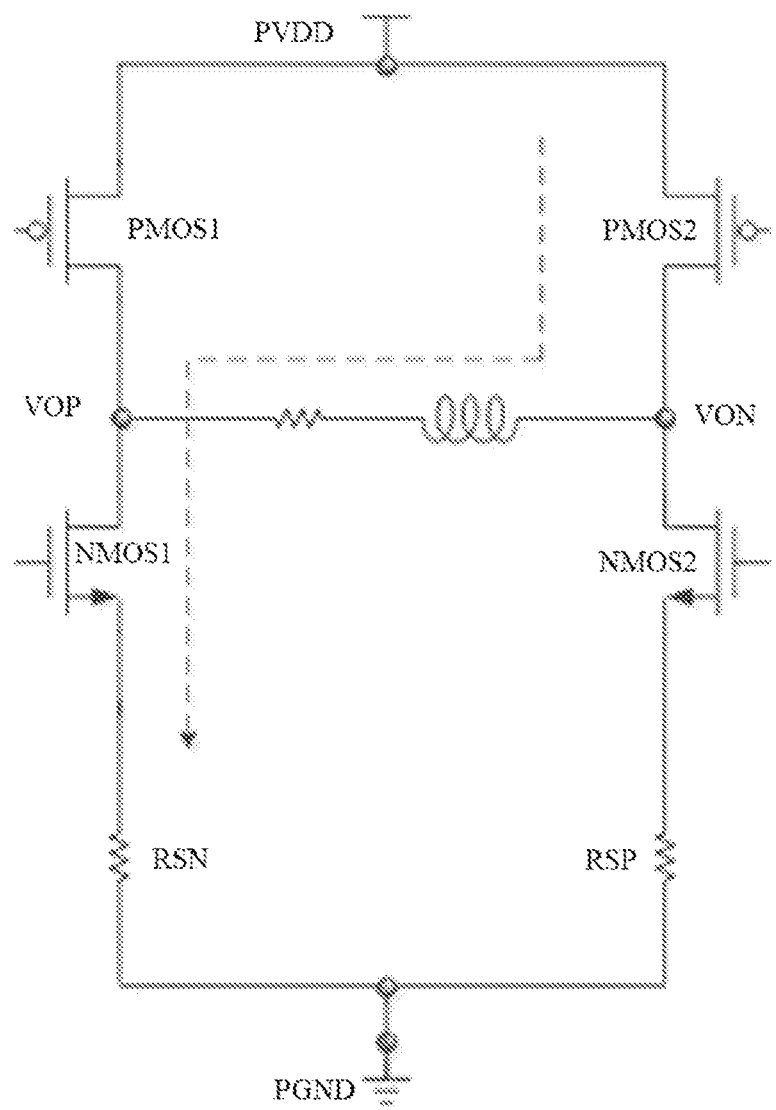
FIG. 4 is a schematic diagram showing a charging process of the Class_D in the tri-state modulation mode during a negative half cycle of a sine wave according to an embodiment of the present disclosure.

Reference is made to FIG. 4, which is a schematic diagram showing a charging process of the Class_D in the tri-state modulation mode during a negative half cycle of a sine wave according to an embodiment of the present disclosure.

Figure 5:
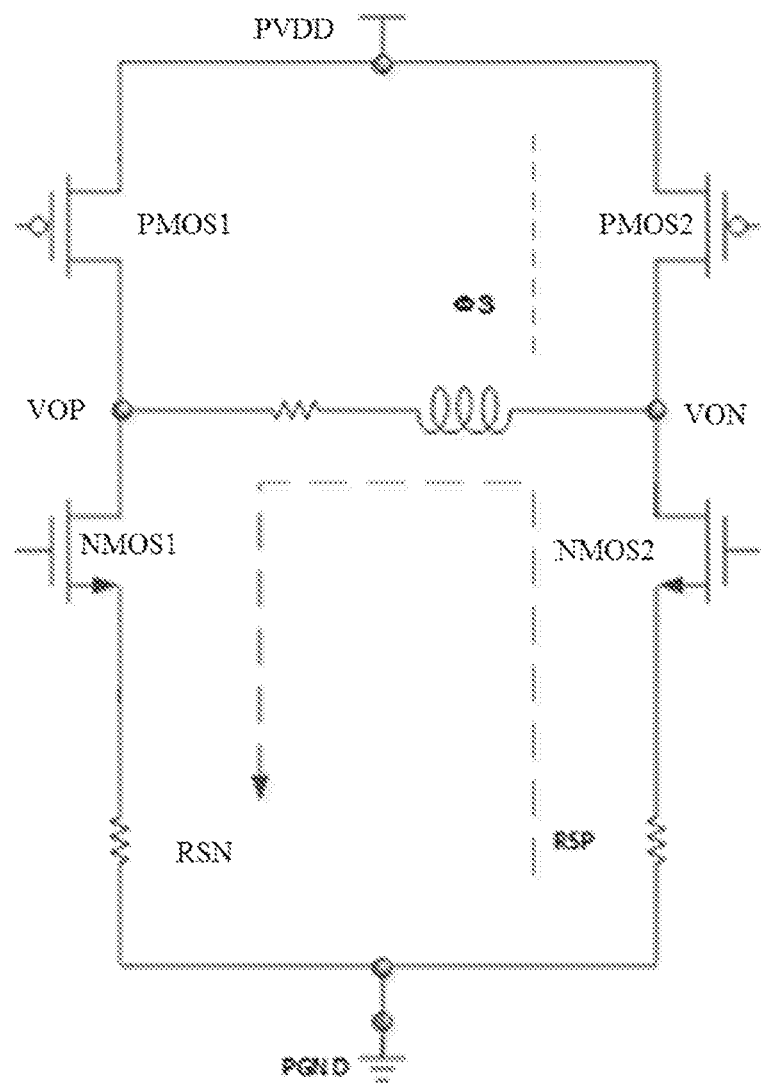
FIG. 5 is a schematic diagram showing a discharging process of the Class_D in the tri-state modulation mode during a negative half cycle of a sine wave according to an embodiment of the present disclosure.

Reference is made to FIG. 5, which is a schematic diagram showing a discharging process of the Class_D in the tri-state modulation mode during a negative half cycle of a sine wave according to an embodiment of the present disclosure.

Figure 6:
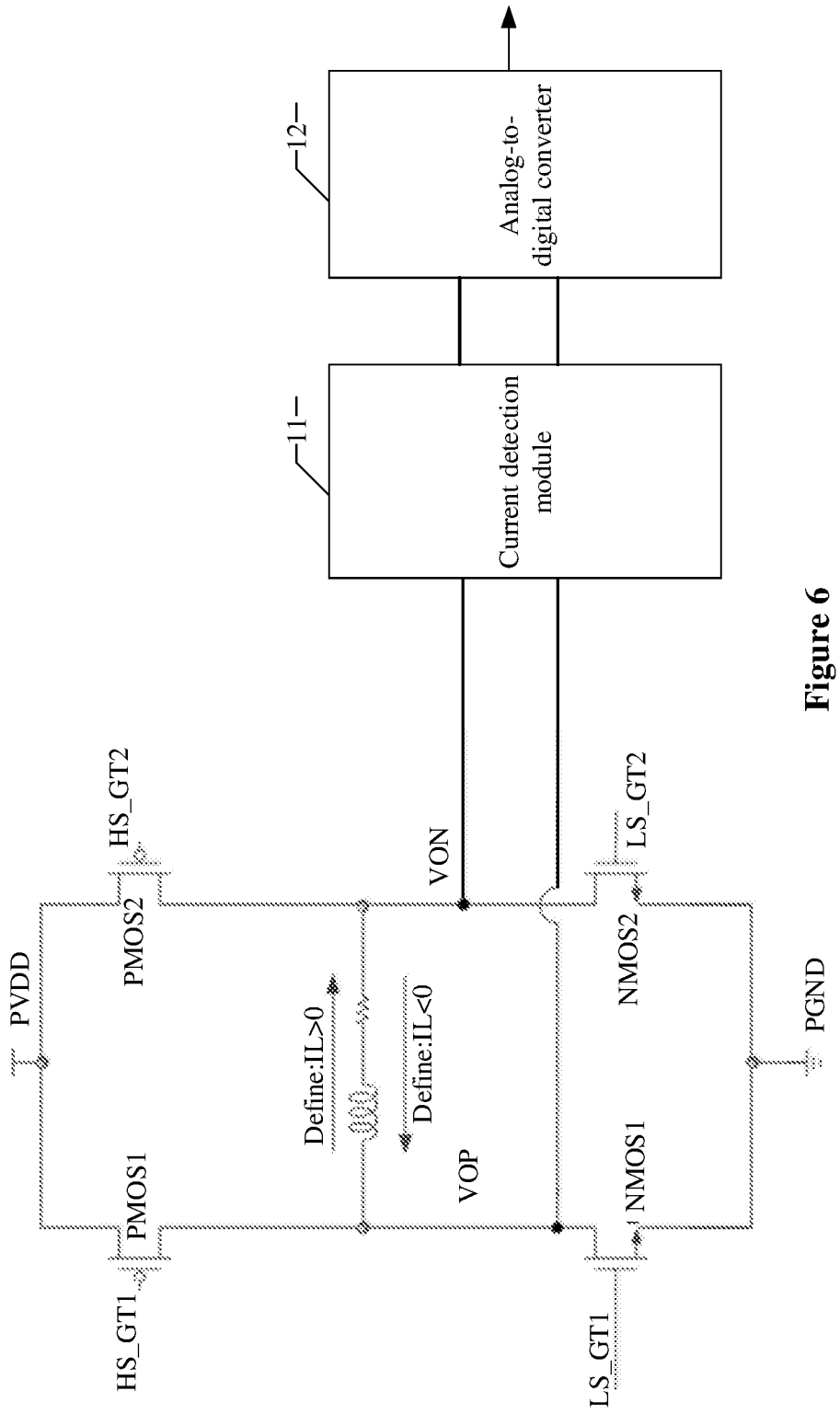
FIG. 6 is a schematic structural diagram showing a current detection circuit for protecting a speaker according to an embodiment of the present disclosure.

Reference is made to FIG. 6, which is a schematic structural diagram showing a current detection circuit for protecting a speaker according to an embodiment of the present disclosure.

The current detection circuit includes a current detection module 11 and an analog-to-digital converter 12.

The current detection module 11 has a first input terminal connected to a first speaker output terminal VON and a second input terminal connected to a second speaker output terminal VOP, and is configured to sample a current flowing through the speaker and convert the sampled current into a voltage, to output a first voltage signal and a second voltage signal.

The analog-to-digital converter 12 has a first input terminal connected to a first output terminal of the current detection module and a second input terminal connected to a second output terminal of the current detection module, and is configured to convert the first voltage signal and the second voltage signal into a PDM code, to calculate a current parameter of the speaker.

In an embodiment, the current detection module 11 (including a current sense and IV converter module) may sample a current flowing through the speaker based on current mirror technology, and convert the current into the voltage to output the first voltage signal and the second voltage signal. The analog-to-digital converter (Sigma delta adc, $\Sigma\Delta ADC$) converts the first voltage signal and the second voltage signal into the PDM code. The current parameter of the speaker is calculated based on the PDM code.

Further, an output of the $\Sigma\Delta ADC$ is filtered by a CIC (cascaded integrator-comb) digital filter, and then the current of the speaker is calculated.

The current detection circuit according to the present disclosure does not increase the power loss of the Class_D circuit. Further, the analog-to-digital converter converts the first voltage signal and the second voltage signal into the PDM code to calculate the current parameter of the speaker, with an effective number of bits up to 12. Even if the Class_D outputs a high power, the current flowing through the speaker can be detected normally without the function of anti-chipping.

Figure 7:
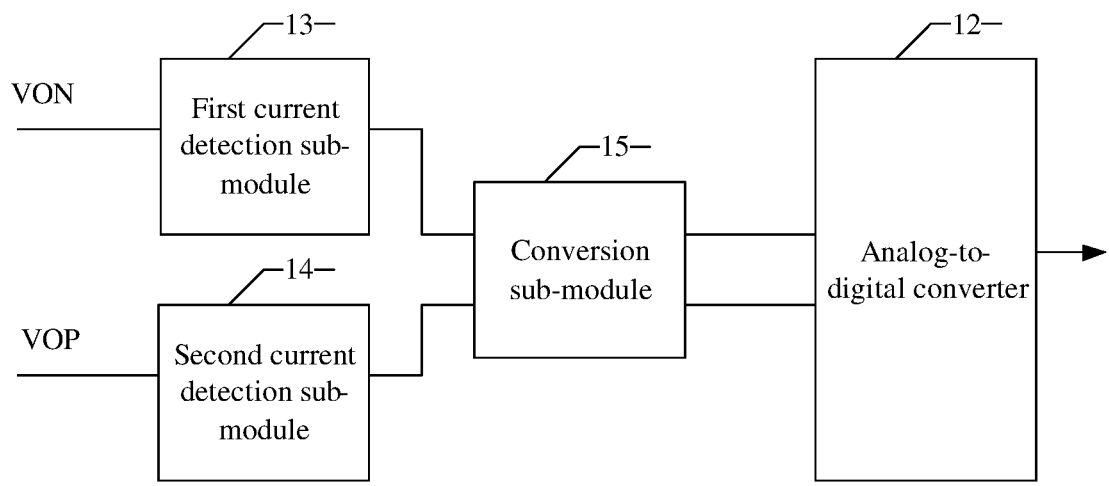
FIG. 7 is a schematic structural diagram showing a current detection module according to an embodiment of the present disclosure.

Further, based on the above embodiments of the present disclosure, reference is made to FIG. 7, which is a schematic structural diagram showing a current detection module according to an embodiment of the present disclosure.

The current detection module includes a first current detection sub-module 13, a second current detection sub-module 14 and a conversion sub-module 15.

The first current detection sub-module 13 is configured to acquire a first current parameter of the first speaker output terminal VON.

The second current detection sub-module 14 is configured to acquire a second current parameter of the second speaker output terminal VOP.

The conversion sub-module 15 is configured to convert the first current parameter into the first voltage signal and convert the second current parameter into the second voltage signal.

Figure 8:
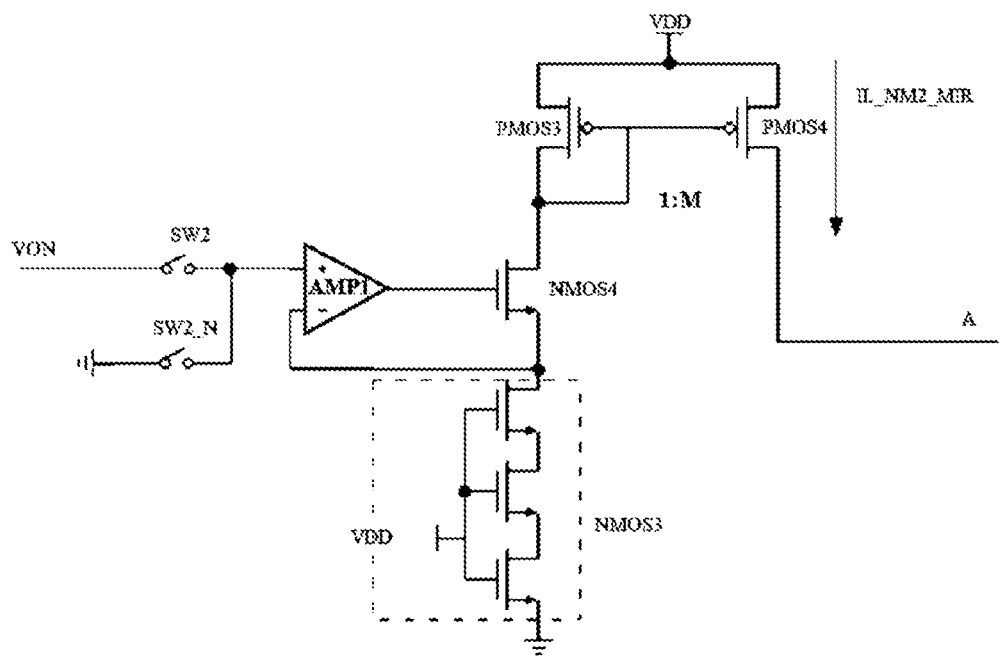
FIG. 8 is a schematic structural diagram showing a first current detection sub-module according to an embodiment of the present disclosure.

Further, based on the above embodiments of the present disclosure, reference is made to FIG. 8, which is a schematic structural diagram showing a first current detection sub-module according to an embodiment of the present disclosure.

The first current detection sub-module 13 includes a first switch SW2, a second switch SW2_N, a first comparator AMP1, a first power transistor NMOS4, a second power transistor PMOS3, a third power transistor PMOS4, and a fourth power transistor NMOS3.

A first terminal of the first switch SW2 is connected to the first speaker output terminal VON, and a second terminal of the first switch SW2 is connected to a non-inverting input terminal of the first comparator AMP1.

A first terminal of the second switch SW2_N is grounded, and a second terminal of the second switch SW2_N is connected to the non-inverting input terminal of the first comparator AMP1.

An inverting input terminal of the first comparator AMP1 is connected to a joint at which the first power transistor NMOS4 is connected to the fourth power transistor NMOS3.

An output terminal of the first comparator AMP1 is connected to a gate of the first power transistor NMOS4.

A source of the first power transistor NMOS4 is connected to a first terminal of the fourth power transistor NMOS3, and a drain of the first power transistor NMOS4 is connected to a drain of the second power transistor PMOS3.

A second terminal of the fourth power transistor NMOS3 is connected to a voltage input terminal VDD, and a third terminal of the fourth power transistor NMOS3 is grounded.

The voltage input terminal VDD is connected to a first joint at which a source of the second power transistor PMOS3 is connected to a source of the third power transistor PMOS4.

The drain of the second power transistor PMOS3 is connected to a second joint at which a gate of the second power transistor PMOS3 is connected to a gate of the third power transistor PMOS4.

A drain of the third power transistor PMOS4 serves as an output terminal A of the first current detection sub-module, and is configured to output the first current parameter.

It should be noted that, as shown in FIG. 8, the fourth power transistor NMOS3 is an integrated power transistor formed by n N-type power transistors connected in series, where n is greater than or equal to one.

Further, based on the above embodiments of the present disclosure, the first power transistor NMOS4 and the fourth power transistor NMOS3 each are an N-type power transistor.

The second power transistor PMOS3 and the third power transistor PMOS4 each are a P-type power transistor.

Figure 9:
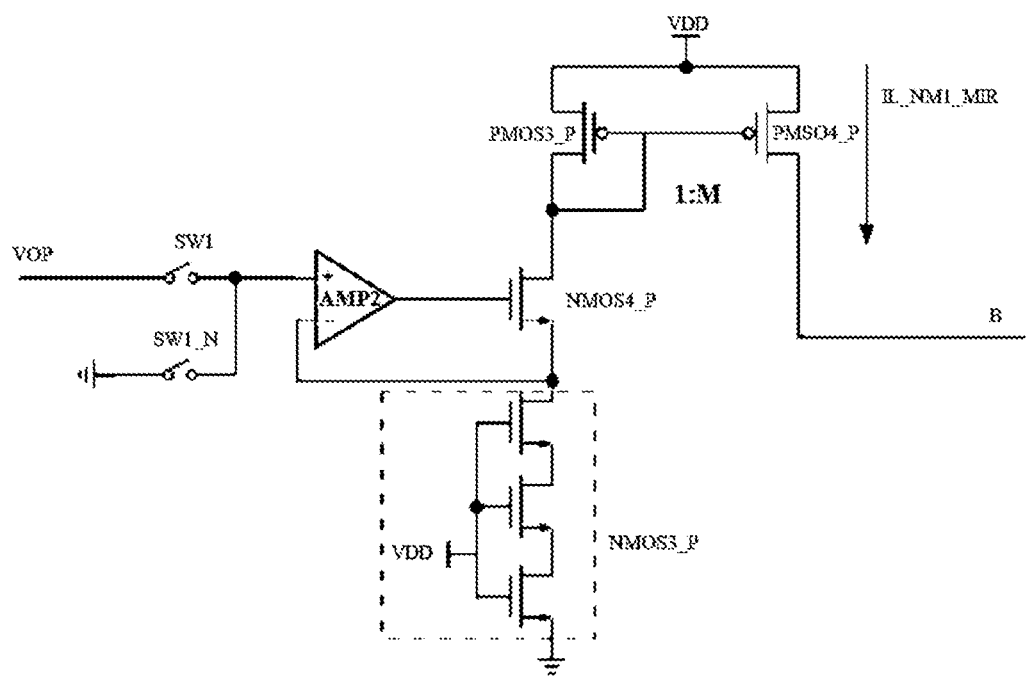
FIG. 9 is a schematic structural diagram showing a second current detection sub-module according to an embodiment of the present disclosure.

Further, based on the above embodiments of the present disclosure, reference is made to FIG. 9, which is a schematic structural diagram showing a second current detection sub-module 14 according to an embodiment of the present disclosure.

The second current detection sub-module includes a third switch SW1, a fourth switch SW1_N, a second comparator AMP2, a fifth power transistor NMOS4_P, a sixth power transistor PMOS3_P, a seventh power transistor PMOS4_P and an eighth power transistor NMOS3_P.

A first terminal of the third switch SW1 is connected to the second speaker output terminal VOP, and a second terminal of the third switch SW1 is connected to a non-inverting input terminal of the second comparator AMP2.

A first terminal of the fourth switch SW1_N is grounded, and a second terminal of the fourth switch SW1_N is connected to the non-inverting input terminal of the second comparator AMP2.

An inverting input terminal of the second comparator AMP2 is connected to a joint at which the fifth power transistor NMOS4_P is connected to the eighth power transistor NMOS3_P.

An output terminal of the second comparator AMP2 is connected to a gate of the fifth power transistor NMOS4_P.

A source of the fifth power transistor NMOS4_P is connected to a first terminal of the eighth power transistor NMOS3_P, and a drain of the fifth power transistor NMOS4_P is connected to a drain of the sixth power transistor PMOS3_P.

A second terminal of the eighth power transistor NMOS3_P is connected to the voltage input terminal VDD, and a third terminal of the eighth power transistor NMOS3_P is grounded.

The voltage input terminal VDD is connected to a third joint at which a source of the sixth power transistor PMOS3_P is connected to a source of the seventh power transistor PMOS4_P.

The drain of the sixth power transistor PMOS3_P is connected to a fourth joint at which a gate of the sixth power transistor PMOS3_P is connected to a gate of the seventh power transistor PMOS4_P.

A drain of the seventh power transistor PMOS4_P serves as an output terminal B of the second current detection sub-module, and is configured to output the second current parameter.

It should be noted that, as shown in FIG. 9, the eighth power transistor NMOS3_P is an integrated power transistor formed by m N-type power transistors connected in series, where m is greater than or equal to one.

Further, based on the above embodiments of the present disclosure, the fifth power transistor NMOS4_P and the eighth power transistor NMOS3_P each are an N-type power transistor. The sixth power transistor PMOS3_P and the seventh power transistor PMOS4_P each are a P-type power transistor.

It can be seen from the above description that the first current detection sub-module samples the first current parameter based on the current mirror of the second power transistor and the third power transistor, and the second current detection sub-module samples the second current parameter based on the current mirror of the sixth power transistor and the seventh power transistor.

Figure 10:
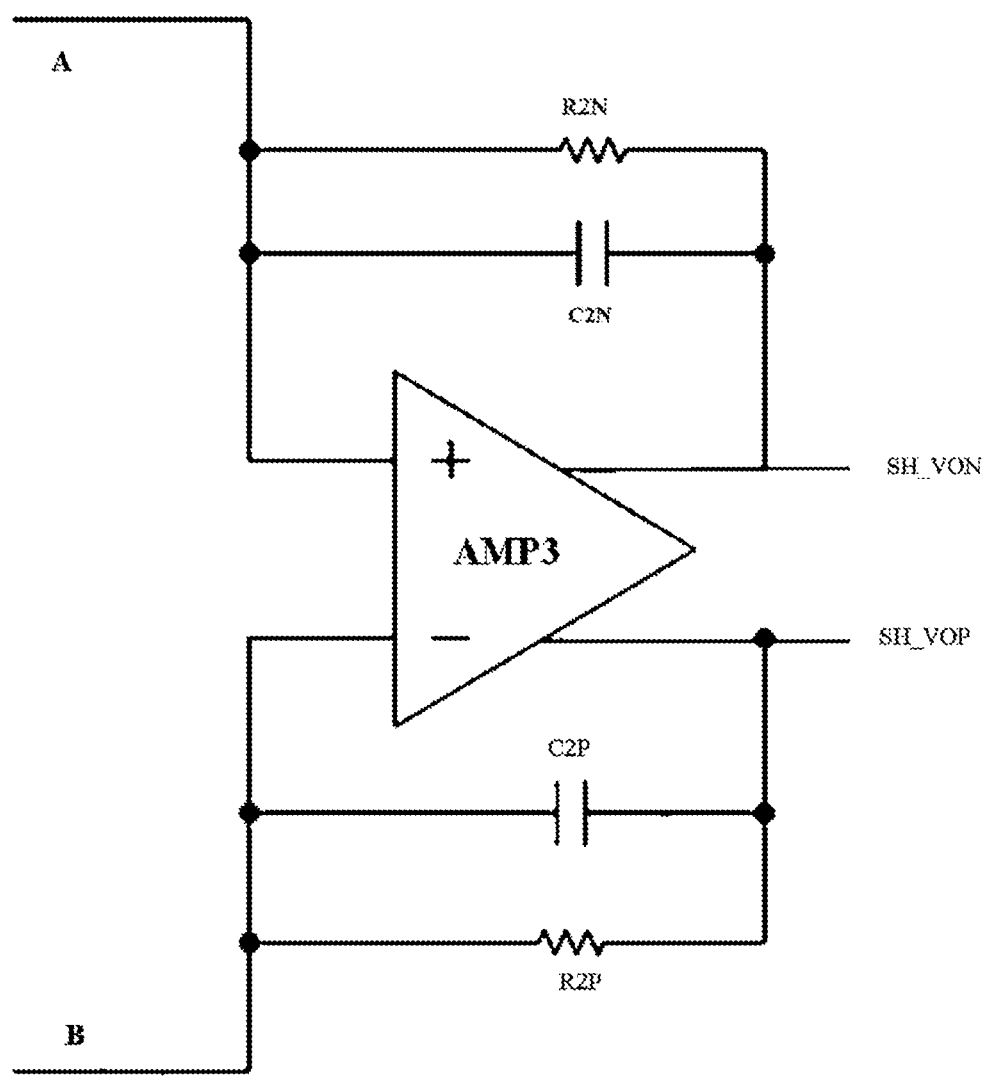
FIG. 10 is a schematic structural diagram showing a conversion sub-module according to an embodiment of the present disclosure.

Further, based on the above embodiments of the present disclosure, reference is made to FIG. 10, which is a schematic structural diagram showing a conversion sub-module according to an embodiment of the present disclosure.

The conversion sub-module 15 includes a first resistor, a second resistor, a first capacitor, a second capacitor and a third comparator.

The first resistor R2N is connected in parallel with the first capacitor C2N to form a first branch. A first terminal of the first branch is connected to the drain of the third power transistor PMOS4 and a non-inverting input terminal of the third comparator AMP3. A second terminal of the first branch is connected to a first output terminal SH_VON of the third comparator AMP3.

The second resistor R2P is connected in parallel with the second capacitor C2P to form a second branch. A first terminal of the second branch is connected to the drain of the seventh power transistor PMOS4_P and an inverting input terminal of the third comparator AMP3. A second terminal of the second branch is connected to a second output terminal SH_VOP of the third comparator AMP3.

The first output terminal SH_VON of the third comparator AMP3 serves as a first output terminal of the current detection module.

The second output terminal SH_VOP serves as a second output terminal of the current detection module.

Based on all the above embodiments of the present disclosure, principles of the current detection circuit are described below.

Figure 11:
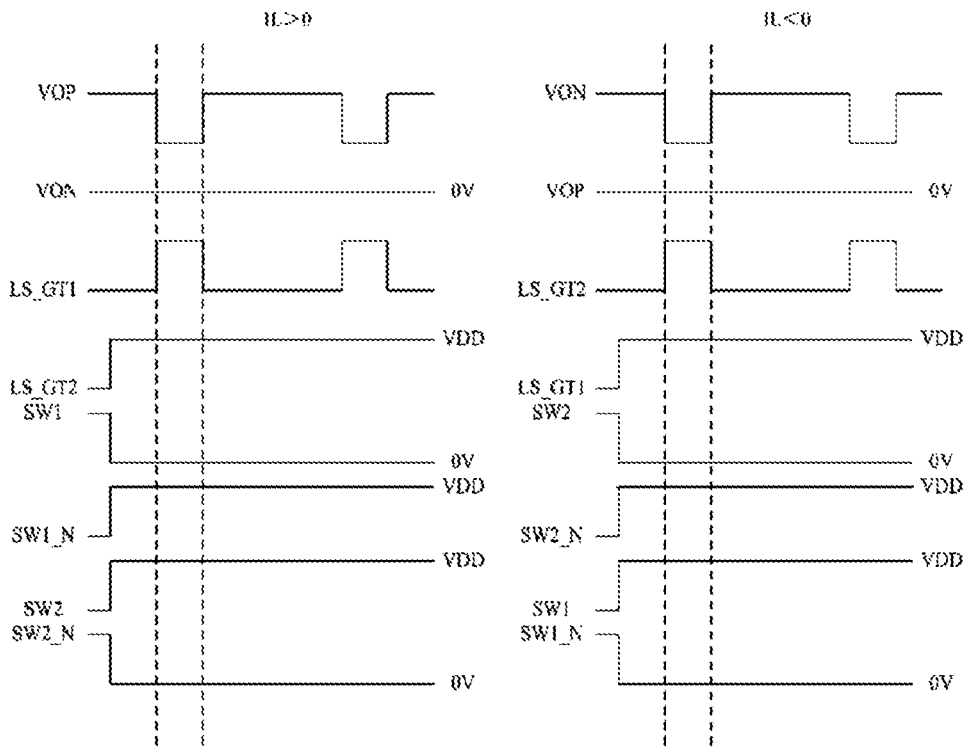
FIG. 11 is a schematic diagram showing waveforms of the current detection circuit for protecting a speaker according to an embodiment of the present disclosure.

Reference is made to FIG. 11, which is a schematic diagram showing waveforms of a current detection circuit for protecting a speaker according to an embodiment of the present disclosure.

The fourth power transistor NMOS3, the eighth power transistor NMOS3_P, the power transistor NMOS1 and the power transistor NMOS2 in the Class_D circuit have a same type. The fourth power transistor NMOS3 and the eighth power transistor NMOS3_P have a same width and a same length. The gate of the fourth power transistor NMOS3 and the gate of the eighth power transistor NMOS3_P each are biased to the voltage input terminal VDD (where a potential at the voltage input terminal VDD is less than 5.5V). Both the fourth power transistor NMOS3 and the eighth power transistor NMOS3_P operate in a linear region. A linear resistor of each of the fourth power transistor NMOS3 and a linear resistor of the eighth power transistor NMOS3_P is calculated from the following equation:

$$R_{nmos3} = R_{nmos3\_p} = \frac{1}{\mu * Cox * \frac{W}{n*L} * (VDD - V_{thn})}$$

W and L respectively represent a width and a length of each power transistor in the fourth power transistor or the eighth power transistor, n represents the number of power transistors connected in series, and $V_{thn}$ represents a threshold voltage of the power transistor.

The first switch SW2 and a gate signal LS_GT2 of the power transistor NMOS2 are in phase. That is, during a positive half cycle of (VOP-VON), the gate signal LS_GT2 is at a high level, the power transistor NMOS2 is on, the first switch SW2 is on and the second switch SW2_N is off, so as to sample the current outputted from the first speaker output terminal VON. In such case, a potential at the first speaker output terminal VON is equal to a source drain voltage Vds_nmos2 of the power transistor NMOS2 operating in the linear region, and is calculated from the following equations:

$$V_{ds\_nmos2} = IL * R_{dson\_nmos2}$$

$$R_{dson\_nmos2} = \frac{1}{\mu * Cox * \left(\frac{W}{L}\right)_{nmos3} * (VDD - V_{thn})}$$

IL represents the current flowing through the speaker, $R_{dson\_nmos2}$ represents on-resistance of the power transistor NMOS2 operating in the linear region, $$\left(\frac{W}{L}\right)_{nmos3}$$

represents a ratio a width of to a length of the power transistor NMOS2.

The sampled current, that is, the first current parameter, is calculated from the following equation:

$$IL\_NM2\_MIR = (V_{ds\_nmos2}/R_{nmos3})*M = IL*(R_{dson\_nmos2}/R_{nmos3})*M$$

where M represents a current mirror ratio of the second power transistor PMOS3 and the third power transistor PMOS4.

During a positive half cycle of (VOP-VON), the first switch SW2 is on and the second switch SW2_N is off, and, the first switch SW1 for sampling the current outputted from the terminal VOP is off and the second switch SW1_N for sampling the current outputted from the terminal VOP is on. The current flowing through the power transistor NMOS1 is not detected. The current indicated by the second current parameter IL_NM1_MIR is equal to zero. A sequence diagram of the process is shown in waveforms in a left half part in FIG. 11.

During a negative half cycle of the sine wave, the current flowing through the power transistor NMOS1 is detected, and the current flowing through the power transistor NMOS2 is not detected. A sequence diagram of the process is shown in waveforms in a right half part in FIG. 11.

LS_GT2 represents a gate signal of the power transistor NMOS2, and LS_GT1 represents a gate signal of the power transistor NMOS1.

The conversion sub-module performs current to voltage conversion on the sampled current IL_NM2_MIR, to output a filtered and amplified signal (SH_VON or SH_VOP). SH_VON is calculated from the following equation:

$$SH\_VON = -IL\_NM2\_MIR*R2N = -IL*(R_{dson\_nmos2}/R_{nmos3})*M*R2N$$

Similarly, SH_VOP is calculated from the following equation:

$$SH\_VOP = -IL\_NM1\_MIR*R2P = -IL*(R_{dson\_nmos1}/R_{nmos3\_p})*N*R2P$$

where N represents a current mirror ratio of the sixth power transistor PMOS3_P and the seventh power transistor PMOS4_P.

Output voltage signals SN_VOP and SN_VON are converted into the PDM code by the analog-to-digital converter (Sigma delta adc, ΣΔADC). The PDM code outputted from the ΣΔADC is filtered by the CIC digital filter, and then the current flowing through the speaker is calculated.

The conversion sub-module has a function of low-pass filtering. The conversion sub-module filters out high-frequency components in voltages sampled at terminals VOP and VON, and transmits filtered voltages to the analog-to-digital converter, to prevent high-frequency noise from being folded into an audio range, thereby preventing a signal-to-noise ratio of the current detection from being reduced, where a −3 dB bandwidth is calculated from the following equation:

$$f(-3\text{ dB}) = \frac{1}{2*\pi*R2N*C2N}$$

During the negative half cycle, the current flowing through the power transistor NMOS1 is detected, that is, a potential at the terminal VOP is sampled, and the current flowing through the power transistor NMOS2 is not detected. SW1 is on, and SW1_N is off. SW2 for sampling the current outputted from the terminal VON is off and SW2_N for sampling the current outputted from the terminal VON is on. A sequence diagram of the process is shown in waveforms in a right half part in FIG. 11.

Figure 12:
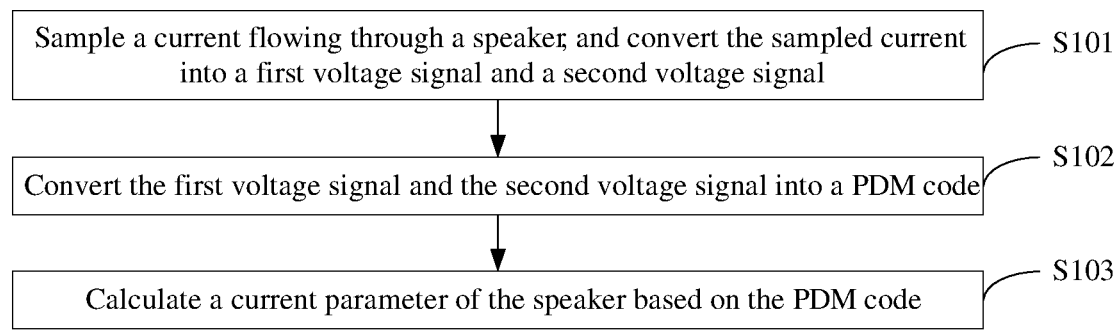
FIG. 12 is a flowchart showing a current detection method for protecting a speaker according to an embodiment of the present disclosure.

Based on all the above embodiments of the present disclosure, a current detection method for protecting a speaker is further provided according to another embodiment of the present disclosure. Reference is made to FIG. 12, which is a flowchart showing a current detection method for protecting a speaker according to an embodiment of the present disclosure.

The current detection method includes the following steps S101 to S103.

In step S101, a current flowing through the speaker is sampled, and the sampled current is converted into a first voltage signal and a second voltage signal.

In step S102, the first voltage signal and the second voltage signal are converted into a PDM code.

In step S103, a current parameter of the speaker is calculated based on the PDM code.

It should be noted that principles of the current detection method according to the embodiment of the present disclosure is the same as principles of the current detection circuit, and thus are not repeated here.

Further, based on the above embodiment, the step S101 is performed as follows.

During a positive half cycle of a sine wave, a current outputted from a first speaker output terminal of the speaker is sampled, to acquire a first current parameter.

During a negative half cycle of the sine wave, a current outputted from a second speaker output terminal of the speaker is sampled, to acquire a second current parameter.

The first current parameter is converted into the first voltage signal, and the second current parameter is converted into the second voltage signal.

Based on all the above embodiments of the present disclosure, a chip is further provided according to another embodiment of the present disclosure. The chip includes the current detection circuit described above, so that the chip has all functions of the current detection circuit.

The current detection circuit and method for protecting a speaker, and the chip according to the present disclosure are described in detail above. Specific examples are used herein to explain the principle and embodiments of the present disclosure, and the above description of the embodiments is only used to facilitate understanding of the method and core concept of the present disclosure. In addition, for those skilled in the art, variations may be made to the embodiments and the application range based on the idea of the present disclosure. Therefore, the specification should not be understood as limitation of the present disclosure.

It should be noted that the embodiments of the present disclosure are described in a progressive manner, and each embodiment places emphasis on the difference from other embodiments. Therefore, one embodiment may refer to another embodiment for the same or similar parts. Since the device disclosed in the embodiment corresponds to the method disclosed in the embodiment, the description for the device is simple, and reference may be made to the method in the embodiment for the relevant parts.

It should be further noted that the relationship terminologies such as "first" and "second" are only used herein to distinguish one entity or operation from another entity or operation, rather than to necessitate or imply that the actual relationship or order exists between the entities or operations. Moreover, terms of "include", "comprise" or any other variants are intended to be non-exclusive. Therefore, a process, method, article or device including multiple elements includes not only the elements but also other elements that are not enumerated, or also includes the elements inherent for the process, method, article or device. Unless expressively limited otherwise, the statement "comprising (including) one . . . " does not exclude the case that other similar elements exist in the process, method, article or device.

Based on the above description of the disclosed embodiments, those skilled in the art can implement or carry out the present disclosure. It is apparent for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A current detection circuit for protecting a speaker, comprising: a current detection module and an analog-to-digital converter, wherein
a first input terminal of the current detection module is connected to a first speaker output terminal, a second input terminal of the current detection module is connected to a second speaker output terminal, and the current detection module is configured to sample a current flowing through the speaker and convert the sampled current into a voltage, to output a first voltage signal and a second voltage signal; and
a first input terminal of the analog-to-digital converter is connected to a first output terminal of the current detection module, a second input terminal of the analog-to-digital converter is connected to a second output terminal of the current detection module, and the analog-to-digital converter is configured to convert the first voltage signal and the second voltage signal into a pulse-density modulation (PDM) code, to calculate a current parameter of the speaker.

2. The current detection circuit according to claim 1, wherein the current detection module comprises a first current detection sub-module, a second current detection sub-module and a conversion sub-module, wherein
the first current detection sub-module is configured to acquire a first current parameter at the first speaker output terminal;
the second current detection sub-module is configured to acquire a second current parameter at the second speaker output terminal; and
the conversion sub-module is configured to convert the first current parameter into the first voltage signal and convert the second current parameter into the second voltage signal.

3. The current detection circuit according to claim 2, wherein the first current detection sub-module comprises a first switch, a second switch, a first comparator, a first power transistor, a second power transistor, a third power transistor and a fourth power transistor, wherein
a first terminal of the first switch is connected to the first speaker output terminal, and a second terminal of the first switch is connected to a non-inverting input terminal of the first comparator;
a first terminal of the second switch is grounded, and a second terminal of the second switch is connected to the non-inverting input terminal of the first comparator;
an inverting input terminal of the first comparator is connected to a joint at which the first power transistor is connected to the fourth power transistor;

an output terminal of the first comparator is connected to a gate of the first power transistor;

a source of the first power transistor is connected to a first terminal of the fourth power transistor, and a drain of the first power transistor is connected to a drain of the second power transistor;

a second terminal of the fourth power transistor is connected to a voltage input terminal, and a third terminal of the fourth power transistor is grounded;

the voltage input terminal is connected to a first joint at which a source of the second power transistor is connected to a source of the third power transistor; and the drain of the second power transistor is connected to a second joint at which a gate of the second power transistor is connected to a gate of the third power transistor.

4. The current detection circuit according to claim 3, wherein the first power transistor and the fourth power transistor each are an N-type power transistor; and the second power transistor and the third power transistor each are a P-type power transistor.

5. The current detection circuit according to claim 3, wherein the fourth power transistor is an integrated power transistor formed by n N-type power transistors connected in series, wherein n is greater than or equal to one.

6. The current detection circuit according to claim 2, wherein the second current detection sub-module comprises a third switch, a fourth switch, a second comparator, a fifth power transistor, a sixth power transistor, a seventh power transistor and an eighth power transistor, wherein a first terminal of the third switch is connected to the second speaker output terminal, and a second terminal of the third switch is connected to a non-inverting input terminal of the second comparator;

a first terminal of the fourth switch is grounded, and a second terminal of the fourth switch is connected to the non-inverting input terminal of the second comparator;

an inverting input terminal of the second comparator is connected to a joint at which the fifth power transistor is connected to the eighth power transistor;

an output terminal of the second comparator is connected to a gate of the fifth power transistor;

a source of the fifth power transistor is connected to a first terminal of the eighth power transistor, and a drain of the fifth power transistor is connected to a drain of the sixth power transistor;

a second terminal of the eighth power transistor is connected to a voltage input terminal, and a third terminal of the eighth power transistor is grounded;

the voltage input terminal is connected to a third joint at which a source of the sixth power transistor is connected to a source of the seventh power transistor; and the drain of the sixth power transistor is connected to a fourth joint at which a gate of the sixth power transistor is connected to a gate of the seventh power transistor.

7. The current detection circuit according to claim 6, wherein the fifth power transistor and the eighth power transistor each are an N-type power transistor; and the sixth power transistor and the seventh power transistor each are a P-type power transistor.

8. The current detection circuit according to claim 6, wherein the eighth power transistor is an integrated power transistor formed by m N-type power transistors connected in series, wherein m is greater than or equal to one.

9. The current detection circuit according to claim 2, wherein the conversion sub-module comprises a first resistor, a second resistor, a first capacitor, a second capacitor and a third comparator, wherein the first resistor is connected in parallel with the first capacitor to form a first branch, a first terminal of the first branch is connected to an output terminal of the first current detection sub-module and a non-inverting input terminal of the third comparator, and a second terminal of the first branch is connected to a first output terminal of the third comparator;

the second resistor is connected in parallel with the second capacitor to form a second branch, a first terminal of the second branch is connected to an output terminal of the second current detection sub-module and an inverting input terminal of the third comparator, a second terminal of the second branch is connected to a second output terminal of the third comparator;

the first output terminal of the third comparator serves as the first output terminal of the current detection module; and the second output terminal of the third comparator serves as the second output terminal of the current detection module.

10. A chip, comprising: the current detection circuit according to claim 1.

11. A current detection method for protecting a speaker, comprising:

sampling a current flowing through the speaker, and converting the sampled current into a first voltage signal and a second voltage signal;

converting the first voltage signal and the second voltage signal into a pulse-density modulation (PDM) code; and calculating a current parameter of the speaker based on the PDM code.

12. The current detection method according to claim 11, wherein the sampling a current flowing through the speaker, and converting the sampled current into a first voltage signal and a second voltage signal comprises:

sampling, during a positive half cycle of a sine wave, a current outputted from a first speaker output terminal of the speaker, to acquire a first current parameter;

sampling, during a negative half cycle of the sine wave, a current outputted from a second speaker output terminal of the speaker, to acquire a second current parameter; and converting the first current parameter into the first voltage signal, and converting the second current parameter into the second voltage signal.

\* \* \* \* \*